US009343243B2

(12) United States Patent
Kondrus

(10) Patent No.: US 9,343,243 B2
(45) Date of Patent: May 17, 2016

(54) ACTUATION DEVICE FOR AN EXPLOSION-PROOF HOUSING

(71) Applicant: R. Stahl Schaltgerate GmbH, Waldenburg (DE)

(72) Inventor: Elena Kondrus, Kunzelsau (DE)

(73) Assignee: R. Stahl Schaltgeräte GmbH, Waldenburg (DE)

( * ) Notice: Subject to any disclaimer, the term of this patent is extended or adjusted under 35 U.S.C. 154(b) by 0 days.

(21) Appl. No.: 14/559,502

(22) Filed: Dec. 3, 2014

(65) Prior Publication Data

US 2015/0155111 A1 Jun. 4, 2015

(30) Foreign Application Priority Data

Dec. 4, 2013 (DE) ........................ 10 2013 113 429

(51) Int. Cl.

| | |
|---|---|
| ***H01H 3/20*** | (2006.01) |
| ***H05K 5/00*** | (2006.01) |
| ***H01H 9/04*** | (2006.01) |
| ***H01H 3/12*** | (2006.01) |
| *H01H 13/06* | (2006.01) |
| *H01H 19/635* | (2006.01) |

(52) U.S. Cl.

CPC . *H01H 3/20* (2013.01); *H01H 3/12* (2013.01); *H01H 9/042* (2013.01); *H05K 5/0017* (2013.01); *H01H 13/06* (2013.01); *H01H 19/6355* (2013.01)

(58) Field of Classification Search

CPC . H05K 5/0017; H01H 9/042; H01H 19/6355; H01H 3/20; H01H 13/06; H01H 3/12

USPC ........................................................ 200/43.13

See application file for complete search history.

(56) References Cited

U.S. PATENT DOCUMENTS 2,637,789 A * 5/1953 Critchfield ............ B60R 25/007 180/69.2
3,246,110 A * 4/1966 Hermanson .......... H01H 13/023 200/314
3,287,516 A * 11/1966 Nielsen .................. H01H 9/042 200/302.1
3,681,553 A * 8/1972 Lehman ................. H01H 13/06 200/302.1

* cited by examiner

*Primary Examiner* — Edwin A. Leon

(74) *Attorney, Agent, or Firm* — Leydig, Voit & Mayer, Ltd.

(57) ABSTRACT

An actuation device (11) for an explosion-proof housing (10) in compliance with the ignition protection category "pressure-proof encapsulation". The actuation device (11) has an actuation unit (15) with a manually actuatable actuation element (16), and an actuation device (11) having a switch unit (14) with a switch element (14) for switching an associated electrical contact. The actuation unit (15) is located outside the housing (10), whereas the switch unit (13) is located in the interior space (12) of the housing (10). An adapter device (22) mechanically connects the actuation unit (15) and the switch unit (13) and comprises at least one adapter plunger (38) that is supported so as to be movable in axial direction (A) in order to transmit the movement of the actuation element (16) via the adapter plunger (38) to the switch element (14). The adapter plunger (38) is arranged in an adapter channel (39) so as to be axially shiftable while forming a gap (53) that is resistant to ignition transmission.

20 Claims, 5 Drawing Sheets

ACTUATION DEVICE FOR AN EXPLOSION-PROOF HOUSING

CROSS-REFERENCE TO RELATED APPLICATION

This patent application claims the benefit of German Patent Application No. 10 2013 113 429.7, filed Dec. 4, 2013, which is incorporated by reference.

FIELD OF THE INVENTION

The invention relates to an actuation device for an explosion-proof housing and to a housing comprising such an actuation device. The housing preferably is configured in compliance with the ignition protection category "pressure-proof encapsulation (Ex-d)".

BACKGROUND OF THE INVENTION

Explosion-proof housings are disposed to accommodate potential sources of ignition that could result in an ignition of a potentially explosive atmosphere and to prevent ignitable hot gasses or ignition sparks from seeping from the interior of the housing into the potentially explosive atmosphere. In such housings, passages through the housing wall present a problem. At such passage locations it must be ensured that an ignition of the potentially explosive atmosphere in the environment of the housing can be precluded. For example, in the region of the passage in explosion-proof housings of the ignition protection category "pressure-proof encapsulation", gaps resistant to ignition transmission can be formed that, however, these necessitate high manufacturing costs in order to satisfy the requirements of explosion protection as defined, in particular, by standard EN 60079-1.

High engineering costs are necessitated by actuation devices comprising an actuation unit located outside the housing interior, for example a rotary switch, a push-button, a push-key or the like. The actuation movement by an operator must be transmitted by the actuation unit in the housing interior to a switch unit. Any electrical, electromechanical or mechanical unit may be considered as the switch unit in which a switch element is to be moved consistent with the actuation or switch setting on the actuation unit. The actuation device must be inserted in an explosion-proof manner through the wall of the housing and must itself not act as the ignition source for the potentially explosive atmosphere. Consequently, high costs, as well as testing and certification of the actuation device, are required in order for such a device to be approved for use in potentially explosive environments and for installation in explosion-proof housings.

Publication U.S. Pat. No. 5,577,603 A describes an explosion-proof housing comprising a pivotally supported lid. A shaft extends through the pivotable lid. On the exterior end of the shaft is seated an actuation unit and on the interior end of the shaft a fork-like slit coupling piece is provided. The slit in the coupling piece is disposed to enclose a toggle switch of a switch unit located on the interior of the housing in a positive-locking manner. The slit of the coupling piece is arranged so as to be eccentric to the axis of rotation of the shaft that extends through the lid of the housing. When the actuation unit outside the housing is rotated, the slit of the coupling piece is pivoted and can cause the rocker switch to be switched. In doing so, a rotary movement of the actuation unit via the shaft extending through the housing wall is transmitted on the inside to a coupling piece and can be utilized for a rocking movement of a rocker switch.

Publication WO 2008/113429 A1 describes an explosion-proof housing comprising a disconnectable switch shaft. A bushing is installed in a housing. The bushing has a passage channel through which extends a shaft. In the housing interior, the shaft is coupled with a switch unit. The shaft can be rotated outside the housing interior via the actuation unit and, in doing so, the switch unit can be actuated. The arrangements are only able to transmit rotary motions.

BACKGROUND OF THE INVENTION

It is an object of the invention to provide an actuation device for an explosion proof housing that is adapted for more reliable operation and cost effective implementation.

The actuation device comprises a mechanical actuation unit with a first carrier. An actuating element is supported by the first carrier so as to be movable in axial direction relative to said first carrier. The actuation element can be moved in axial direction by a push-button or a push-key. Alternatively, the actuation unit may comprise a rotary switch or turnkey. Its rotary motion can be translated into an axial motion by a transmission. The transmission may be a cam, a tapered land arrangement or the like. Due to an inclined surface opposite the axial direction as well as an inclined surface in the direction of rotation, it is possible to generate an axial movement of the actuation element.

The actuation device further comprises a switch unit. The switch unit has a second carrier on which is arranged at least one switch element that can be moved in axial direction. When installed, the switch unit is located in the interior of the explosion-proof housing. For example, the switch unit may be an electrical or electromechanical switch that may act as the ignition source and thus is also accommodated in the housing. In an assembled operative state, the actuation unit is located outside the interior of the housing.

Furthermore, the actuation device comprises an adapter device with an adapter body. The adapter body extends in axial direction, in which case it extends through the housing wall in an assembled operative position. On its one axial end, the adapter body has a first mounting section and, on its opposite other axial end, it has a second mounting section. At least one adapter channel extends in axial direction in the adapter body, in which case, in each channel an adapter plunger is supported as to be movable in axial direction. The number of adapter plungers corresponds to the number of switch elements or switch positions of the switch unit that are to be actuated. There may be one, two or even more switch elements or switch positions and a corresponding number of adapter plungers. If two or more adapter plungers are provided, the plunger channels extend parallel to each other and, in particular, along a longitudinal axis extending at a distance from the axial direction through the adapter body. A gap resistant to ignition is formed at least in one axial section between each adapter plunger and the associate adapter channel. As a result of this, it is ensured that there will be no ignition starting in the housing interior and moving through the at least one adapter channel into a potentially explosive atmosphere.

In a preferred embodiment, the at least one adapter plunger is pretensioned in a starting position toward the actuation unit or the actuation element by means of a pretensioning means, for example a spring, preferably a helical spring. By means of the actuation element, the adapter plunger can be moved or slid in axial direction out of its starting position. A rotary motion of the adapter plunger about its longitudinal axis or about the axial direction is not caused by the at least one actuation element. Each adapter plunger has a first axial end that is associated with the at least one actuation element. The opposite axial second end of each adapter plunger is associated with a respective switch element of the switch unit. In each instance, it is, preferably, only pressure forces acting in axial direction that are transmitted between the at least one adapter plunger and the actuation element on the first end, as well as between the adapter plunger and the switch element on the second end. To accomplish this, for example, the adapter plunger may have a first plunger face on its first end and a second plunger face on its second end. The plunger face of the first plunger end abuts loosely and without positively locking against the associate actuation element. Conversely, the second plunger face of the adapter plunger can abut loosely and without positively locking against the associate switch element of the switch unit. Preferably, the at least one adapter plunger extends straight along one axis.

The first carrier of the actuation unit is separably connected to the first mounting section, and the second carrier of the switch unit is separably connected to the second actuation section of the adapter device. Consequently, the adapter body acts, at the same time, as the carrier for the actuation unit and for the switch unit. An assembly unit is created. In doing so, the first carrier and the second carrier are immovably arranged on the adapter body.

Adjoining the at least one adapter plunger the transmission means for translating a rotary motion of an actuation element into an axial motion can be arranged in the region of the first mounting section. The transmission means can be associated with the adapter device as an optimal assembly or be a component of the actuation unit.

The two mounting sections on the adapter body between which extends the at least one adapter plunger thus act as mounting section locations for the actuation unit, with or without transmission, on the one hand, and for the switch unit, on the other hand. It is only the adapter device that must satisfy the requirements of an embodiment that is resistant to ignition transmission and that is accordingly tested and certified, respectively. The actuation unit and the switch unit that are used may be standard assemblies. This has the advantage that the use of different actuation units and/or switch units for different applications in combination with always the same tested adapter device is possible. A test for protection against explosion and certification of the entire actuation device for each and every application can thus be omitted. It is sufficient if the adapter device that is used is tested once to satisfy the requirements. Considering different applications, the standard components can be mounted to the adapter device, thus requiring considerably less work and considerably lowering costs.

As a result of the fact that the actuation unit, the adapter device and the switch unit are directly arranged next to each other in a separable manner, a safe operation of the switch unit via the actuation unit is ensured at all times. Even when axial pulling forces are exerted on the actuation unit, the at least one adapter plunger will not move away from the associate switch element in a manner that a safe actuation of the switch element via the actuation unit is no longer ensured.

In one exemplary embodiment the adapter device comprises a first mounting device, by means of which the first mounting section of the adapter body is separably connected to the actuation unit. Additionally or alternatively, the adapter device may comprise a second mounting device by means of which the second mounting section of the adapter body is separably connected to the switch unit. Via the first and/or second mounting devices, preferably a positive-locking and/or a nonpositive-locking connection is established, for example a screw connection and/or click-on connection.

In one advantageous exemplary embodiment, the first mounting device comprises a connecting part arranged or held on the actuation unit. The connection part is connected in a positive-locking or a nonpositive-locking manner to the first mounting section of the adapter body in order to establish the separable connection. For example, the connection part may have a thread that comes into engagement with the corresponding counter-thread on the first mounting section. In one exemplary embodiment the connection part is provided with an inside thread that can be separably connected to the outside thread on the first mounting section. In doing so, the connection part represents a union nut. In one exemplary embodiment the first mounting section may be configured as a hollow cylinder.

The connection part can be separably held on the actuation unit by a holding part. For example, the holding part may come into nonpositive and/or positive engagement with a recess on the actuation unit and act as a stop or as a safeguard against loss for the connection part. The arrangement of the holding part and thus the connection part on the actuation unit preferably does not require any tools.

At least at one point, the holding part may be in contact with the first mounting section of the adapter body. As a result of this, the holding part and the first mounting section, together, can form a rotary position setting means. By means of the rotational position presetting means, it is possible to preset the relative rotary position about the axial direction or about the longitudinal axis of the adapter body between the actuation unit and/or the actuation element and/or the first carrier, on the one hand, and the adapter body, on the other hand. Consequently, it is ensured that a desired allocation of the actuation element to the at least one adapter plunger is ensured and that the actuation of the actuation element is safely accomplished via the adapter plunger in view of the associate switch element.

In one embodiment, the adapter body may additionally have a center section having preferably a cylindrical exterior contour. The at least one adapter plunger is supported on or in this center section, or the at least one adapter channel is provided.

Preferably, the actuation unit comprises no electrical or electronic components whatsoever but consists only of mechanical elements that cannot act as an ignition source. Inasmuch as the switch unit is arranged inside the explosion-proof housing, there are no demands made on the switch unit with regard to explosion protection. If the actuation unit comprises components that could act as ignition source, it is advantageous if the actuation unit is configured in compliance with the ignition protection category "increased safety".

In operative mode, the adapter body extends through a preferably essentially cylindrical opening in the housing wall. Between the housing wall and the adapter body, there is a gap resistant to ignition transmission. This gap that is resistant to ignition transmission can be configured as a cylindrical gap without profile, as a gap with a profile or as a threaded gap with an explosion-proof thread.

Other objects and advantages of the invention will become apparent upon reading the following detailed description and upon reference to the drawings, in which:

Figure 1:
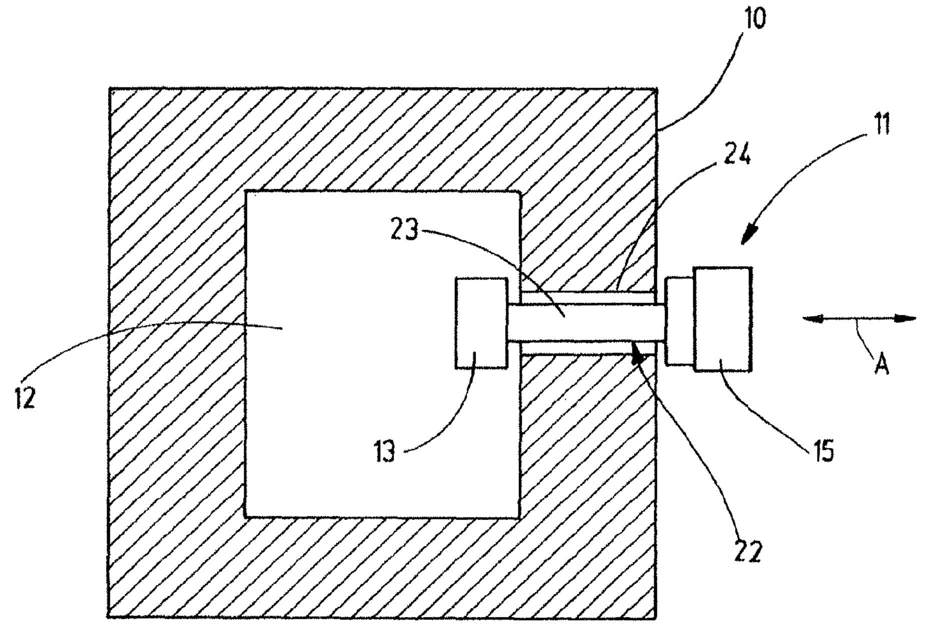
FIG. 1 is a schematic sectional view of an illustrative explosion protection housing having an actuation device in accordance with the present invention.

While the invention is susceptible of various modifications and alternative constructions, certain illustrative embodiments thereof have been shown in the drawings and will be described below in detail. It should be understood, however, that there is no intention to limit the invention to the specific forms disclosed, but on the contrary, the intention is to cover all modifications, alternative constructions, and equivalents falling within the spirit and scope of the invention.

DETAILED DESCRIPTION OF THE PREFERRED EMBODIMENTS

FIG. 1 illustrates, greatly schematized, an explosion-proof housing 10 comprising an actuation device 11 in accordance with the invention. The housing is disposed to accommodate electrical and/or electronic operating means in a housing interior 12, in which case said operating means could act as a potential ignition source in a potentially explosive atmosphere outside the housing 10. In the exemplary embodiment, the housing 10 is designed in compliance with the ignition protection category “pressure-proof encapsulation” (Ex-d).

Figure 2:
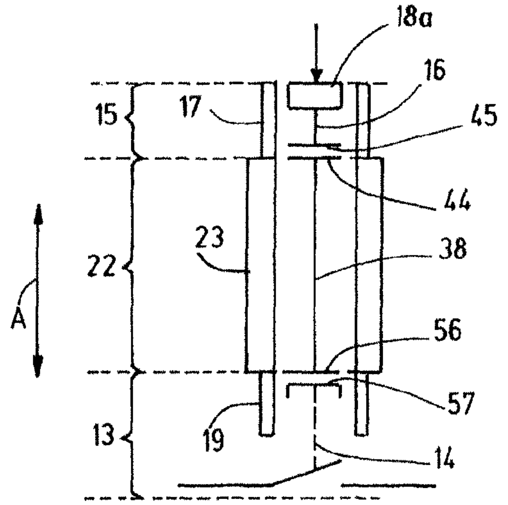
FIG. 2 is a simplified circuit diagram illustrating the function of an exemplary embodiment of the actuation device.
Figure 3:
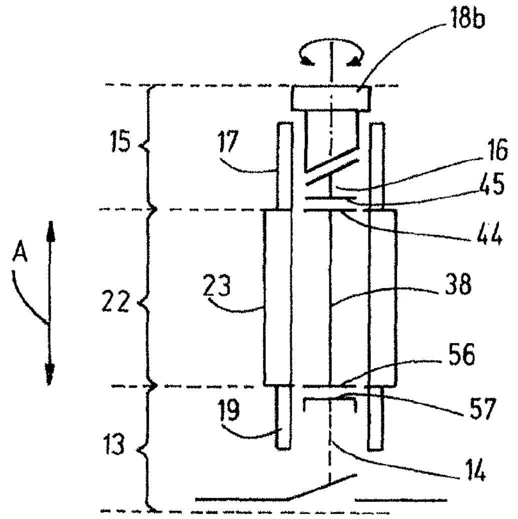
FIG. 3 is a simplified circuit diagram illustrating the function of another exemplary embodiment of the actuation device.
Figure 5:
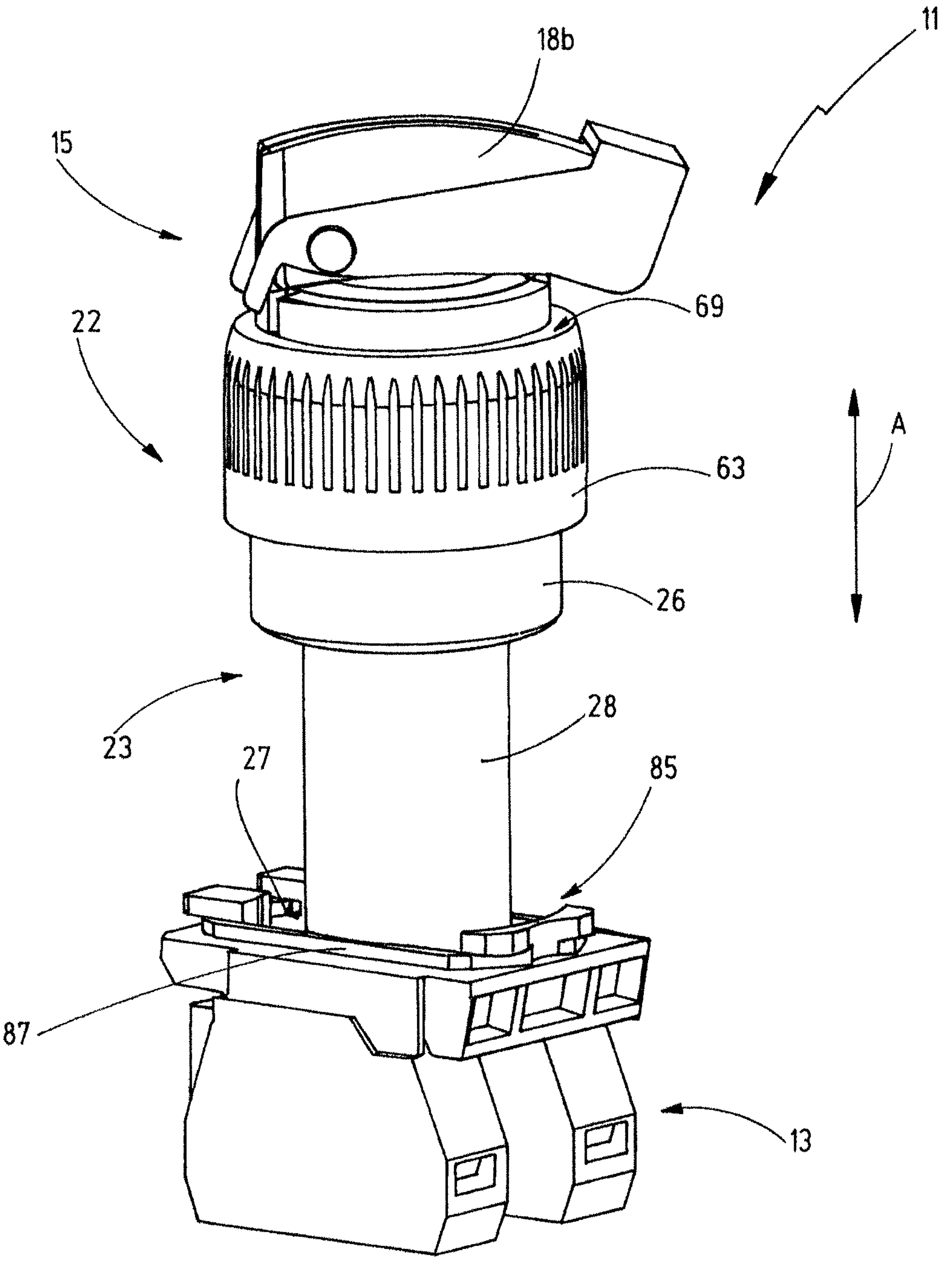
FIG. 5 is an enlarged perspective of the actuation device shown in FIG. 4.

The actuation device 11 comprises a switch unit 13 located in an interior space 12. The switch unit 13 may comprise one or more switch elements 14 that are disposed to be mechanically actuated (FIGS. 2, 3 and 5). An electrical contact may be opened and/or closed by means of the switch element 14. The switch unit 13 is not configured so as to be explosion-proof and, consequently, is arranged as an electrical and/or electronic operating means inside the interior space 12 of the housing 10. The at least one switch element 14 is supported by a second carrier 19 of the switch unit 13 so as to be movable in axial direction A.

Furthermore, an actuation unit 15 located outside the housing 10 and thus outside the interior space 12 in the potentially explosive atmosphere is part of the actuation device 11. The actuation unit 15 comprises an actuation element 16 that is arranged so as to be movable in an axial direction A on a first carrier 17. The axial movement or shifting of the actuation element 16 is accomplished by the manual actuation of a push-button or push-key 18*a* or a rotary switch or turnkey 18*b* of the actuation unit 15. By pressing or rotating the appropriate switch or push-button 18*a*, 18*b*, the actuation element 16 is moved in axial direction between at least two positions. The rotary motion of a rotary switch or a turnkey 18*b* can be converted via a transmission, for example by means of cams and/or inclined surfaces, into an axial movement of the actuation element 16, as is illustrated in a greatly schematized manner in FIG. 3. In conjunction with this, the transmission is shown as part of the actuation unit 15. Alternatively, i.e., as an optional assembly, such a transmission could also be part of an adapter arrangement 22 of the actuation device 11.

Figure 4:
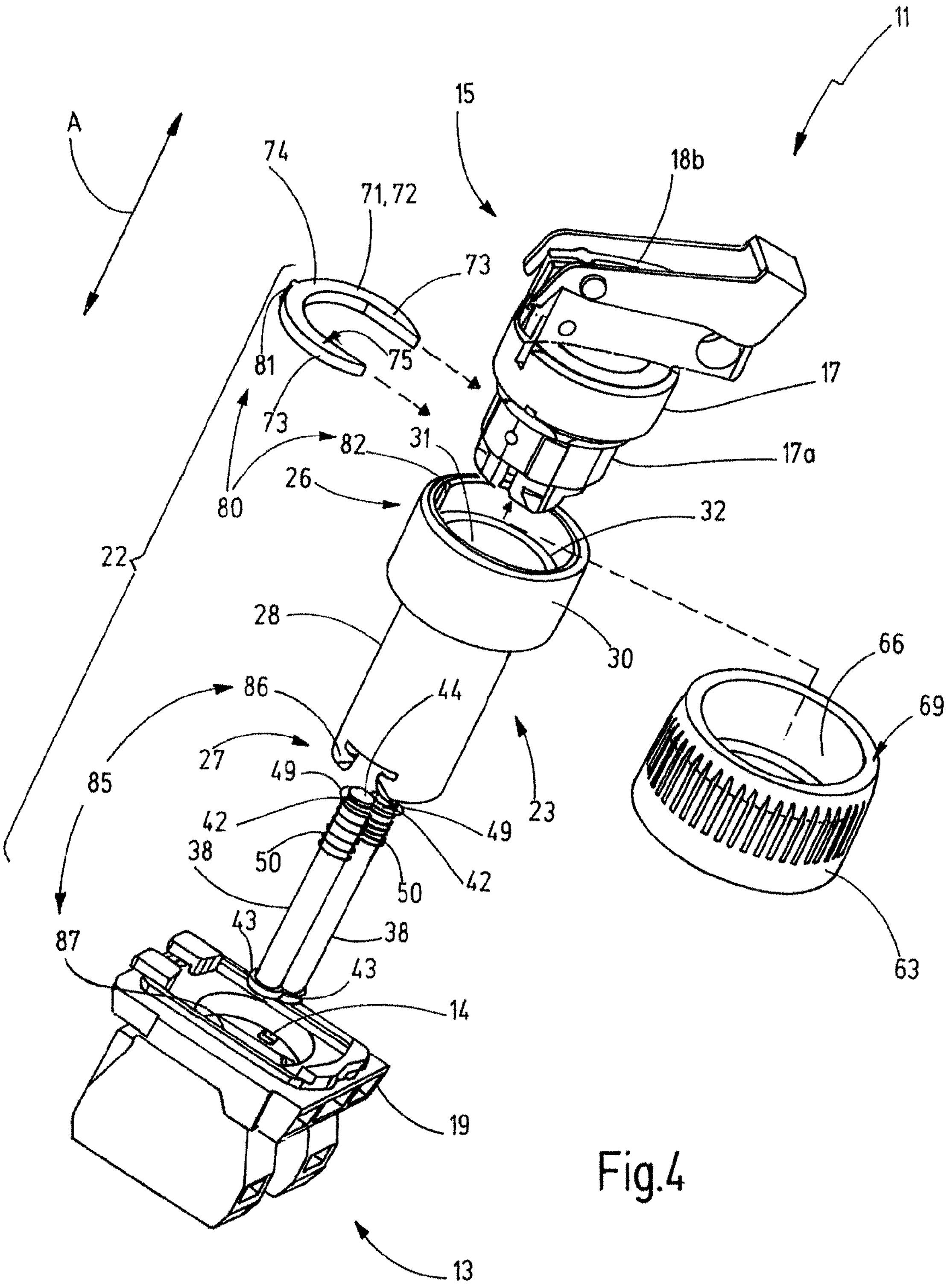
FIG. 4 is an exploded perspective of an exemplary embodiment of the actuation device.
Figure 6:
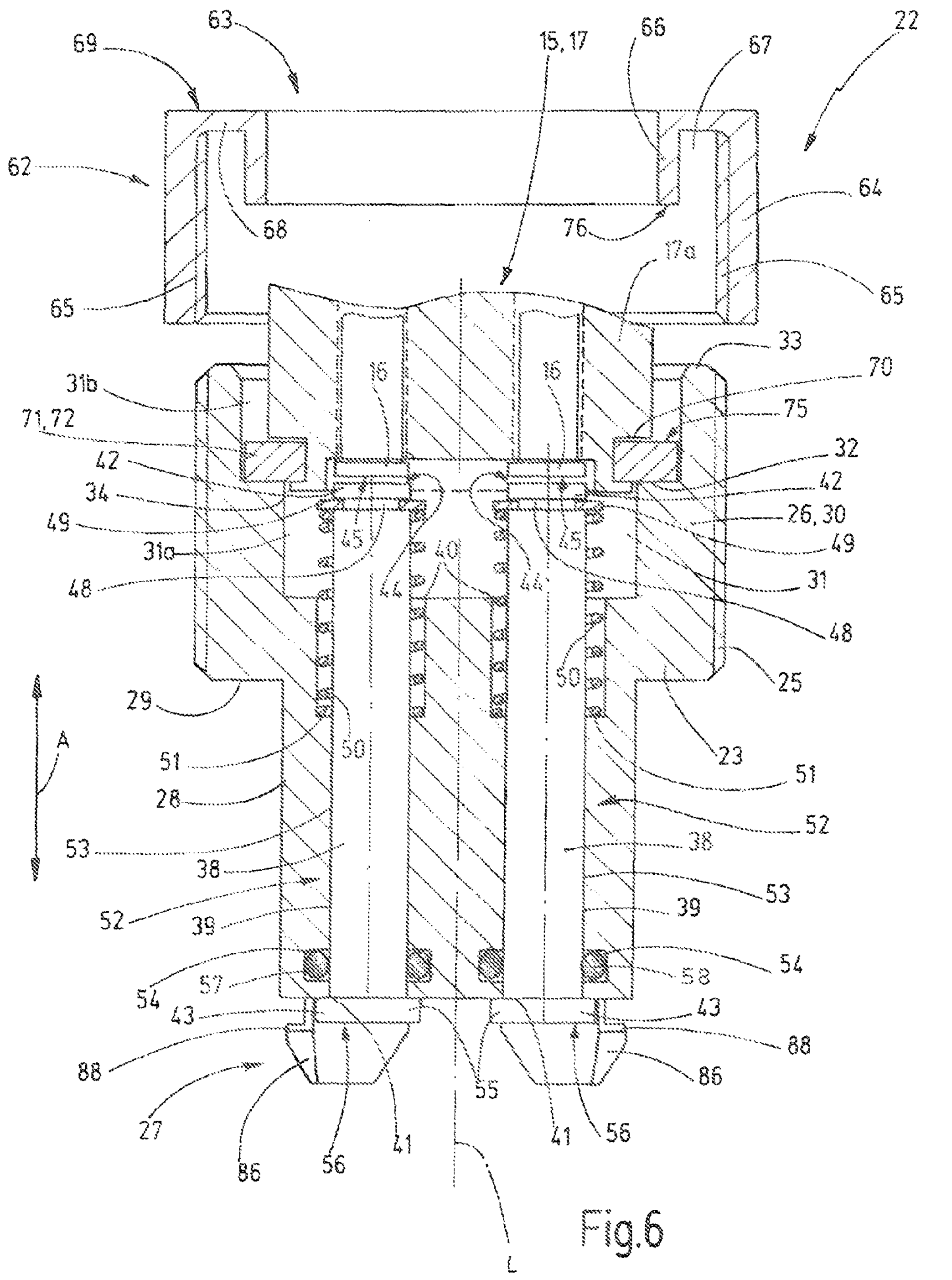
FIG. 6 is an enlarged section view of an adapter device of the actuation device shown in FIGS. 4 and 5.
Figure 7:
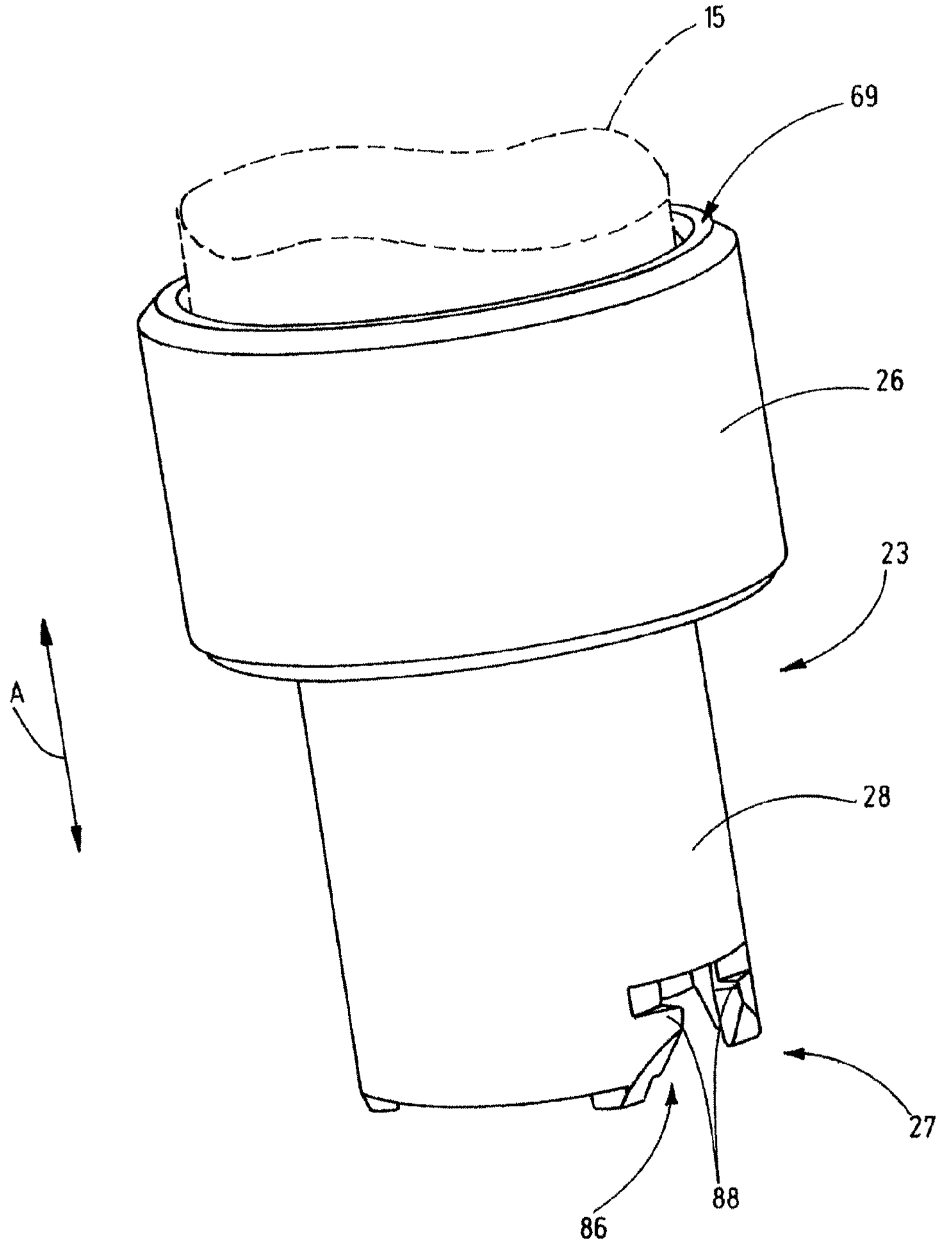
FIG. 7 is a perspective of the adapter device shown in FIG. 6.

The adapter device 22 connects the actuation unit 15 to the switch unit 13. In doing so, an adapter body 23 of the adapter device 22 extends through a housing opening 24 in the housing 10. The arrangement of the adapter body 23 in the housing opening 24 is done so as to be explosion-proof, for example by the formation of an explosion-proof gap. In the preferred exemplary embodiment, the adapter body 23 has an outside thread 25 (FIG. 6) which can be screwed in a corresponding inside thread in the region of the housing opening 14 in an explosion-proof manner. Here, it is pointed out that, in order to simplify the illustration, the outside thread 25 in FIGS. 4, 5 and 7 is not shown, even though it is preferably provided in the exemplary embodiment.

In the exemplary embodiment, the adapter body 23 has a cylindrical contour in at least some sections. The adapter body has a first mounting section 26 and, on the opposite axial end, a second mounting section 27. The two mounting sections 26, 27 are connected to each other by a center section that is referred to as center section 28. Overall, the adapter body 23 is preferably made in one piece of a uniform material without seams or joints.

In accordance with the example, the first mounting section 26 is configured as a hollow cylinder. It has a cylindrical outside surface that is provided with the outside thread 25 in the exemplary embodiment. The diameter of the first mounting section 26 is greater than that of the adjoining center section 28. An annular step 29 or, alternatively, another transition is formed on the outside surface of the adapter body 23 between the first mounting section 26 and the center section 28.

The hollow cylindrical first mounting section 26 is formed by a hollow cylindrical wall 30 of the adapter body 23. The hollow cylindrical wall 30 extends starting from the center section 28 coaxially to a longitudinal axis L of the adapter body 23. The outside thread 25 can completely cover the cylindrical lateral surface of the hollow cylindrical wall 30 in axial direction A. The hollow cylindrical wall 30 encloses a receiving space 31 in peripheral direction about the longitudinal axis L. At least one stop 32 extends into the receiving space 31. In the exemplary embodiment, the stop 32 is configured as an annular surface about the longitudinal axis L. Alternatively thereto, there may also be three or more stops 32 at a distance from each other in peripheral direction. In the exemplary embodiment, the abutment surface or the annular surface of the stop 32 is oriented at a right angle relative to the longitudinal axis L. The abutment surface of the stop 32 faces in the direction of a free end 33 of the hollow cylindrical wall 30 that is located on the side of the first mounting section 26 opposite the center section 28.

In accordance with the example, the stop 32 is formed by an annular projection 34 that reduces the inside diameter of the receiving space 31. As a result of this, the receiving space 31 comprises two cylindrical sections—an interior section 31*a* inside the annular projection 34 and an exterior section 31*b* adjoining interior section 31*a*. The exterior section 31*b* is located axially between the stop 32 and the free end 33 and, in accordance with the example, has a greater diameter than the interior section 31*a*.

The adapter device 22 comprises at least one adapter plunger 38. The number of adapter plungers 38 depends on how many switch elements 14 of the switch unit 14 need to be actuated or on how many switch positions the switch unit 14 includes. The number of adapter plungers 38 may, alternatively or additionally, depend on the number of actuation elements 16 of the actuation unit 15.

However, it is also possible to allocate several actuation elements 16 and/or several switch elements 14 to one adapter plunger 38, for example if different switch positions of the switch or the key 18*a*, 18*b* have the same function and—with the use of the adapter device 22—are to act on the same switch element 14. Whereas each of the schematized illustrations in FIGS. 2 and 3 shows an actuation element 16, an adapter plunger 38 and a switch element 14, the preferred exemplary embodiment as in FIGS. 4 through 7 comprises two separate adapter plungers 38. In modification thereof, it is also possible for more or fewer than two adapter plungers 38 to be present.

Each of the two adapter plungers 38 is supported in an adapter channel 39 so as to be slidable in axial direction A. The adapter channels 39 extend completely through the adapter body 23 in axial direction A, so that said channels have a mouth on each of the two sides. In accordance with the example, the first mouth 40 of each adapter channel is located in the receiving space 31 and, in the exemplary embodiment described here, in the interior section 31*a*. The second mouth 41 of each adapter channel 39 is located in the transition region between the center section 28 and the second mounting section 27.

Each adapter plunger 38 has an axial first end 42 and, on the opposite axial side, a second end 43. Each adapter plunger 38 has, on its first end 42, a first plunger face 44 that is associated with an actuation element 16. In accordance with the example, the first plunger face 44 is located opposite an actuation face 45 of the actuation element 16. The first plunger face 44 may abut in each axial position of the actuation element 16 against the actuation face 45 or, in the inoperative position of the adapter plunger 38 (FIG. 6) be located at a distance opposite the associate actuation face 45. In the exemplary embodiment, the first plunger face 44 and/or the actuation face 45 are oriented at a right angle relative to the axial direction A. The first plunger face 44 and/or the actuation face 45 in the example are flat, however, they may also be configured so as to be complementary to each other. A connection between the first plunger face 44 and the actuation face 45 for the transmission of axial pulling forces does not exist. The two faces 44, 45 are located next to each other without being connected.

Each adapter plunger 38 has a radial annular groove 48 that is open toward the outside, said annular groove being in the region of the first end 42 at a distance from the first plunger face 44. A locking ring 49 extends radially toward the outside away from the adapter plunger 38 and thus forms a support surface for a spring and, in accordance with the example, a helical spring 50. The helical spring 50 is supported on its opposite end by an annular shoulder 51 in the associate adapter channel 39. The annular shoulder 51 is formed in the adapter channel 39 in that said channel—adjoining the first mouth 40—has a larger diameter and decreases, due to the annular shoulder 51, to another, smaller diameter. This smaller diameter of the adapter channel 39 essentially corresponds to the outside diameter of the cylindrical shaft of the adapter plunger 38. The adapter plunger 38 is pretensioned by the spring 50 at a pretensioning force toward the associated actuation element 16 into its inoperative position.

On the axial second end 43, each adapter plunger 38 has an end piece 55. Preferably, the end piece 55 has a larger diameter than the remaining part of the adapter plunger 38, so that it cannot be inserted into the associate adapter channel 39. In the inoperative position of the respective adapter plunger 38, the end piece 55 abuts against the edge region around the second mouth 41 of the adapter body 23. In accordance with the example, the end piece 55 has a cylindrical form. On the end piece 55, a second plunger face 56 is provided, said plunger face being configured as a flat plunger face 56. In accordance with the example, the second plunger face 56 is aligned at a right angle relative to the axial direction A.

The second plunger face 56 faces the respectively associate switch element 14 of the switch unit 13. The switch element 14 comprises a switch face 57 located opposite the second plunger face 56. In inoperative position of the adapter plunger 38, the second plunger face 56 may abut against the associate switch face 57 or be at a minimal axial switch distance thereto. The second plunger face 56 and/or the switch face 57 are configured as in the example, however they may also be configured so as to be complementary to each other. A connection between the second plunger face 56 and the switch face 57 for the transmission of the axial pulling forces does not exist. The two faces 56, 57 lie next to each other without connection to each other.

In an axial section 52 a gap resistant to ignition transmission is formed between the lateral surface of the respective adapter plunger 38 and the channel wall of the adapter channel 39. In the exemplary embodiment, the length of the gap 53 that is resistant to ignition transmission corresponds to the axial distance between the annular shoulder 51 and the second mouth 41 in the respective adapter channel 39. In order to prevent fluids, dust particles or the like from moving through the gap 53 that is resistant to ignition transmission and entering the interior 12 of the housing 10, a ring-shaped sealing groove 54 may hold a seal 58, for example an O-ring. The sealing groove 54 is provided coaxially to the longitudinal axis of the adapter channel 39 and is open toward said channel. Consequently, the seal 58 can abut against the outside surface or the lateral surface of the associate adapter plunger 38. The axial position of the seal 58 and the sealing groove 54, respectively, can basically be selected as desired. Preferably, the seal is close to the second mouth 41 of the adapter channel 39, so that the seal 58 can be very easily set into the associate sealing groove 54.

Furthermore, the adapter device 22 comprises a first mounting device 62 that is disposed to establish a separable connection between the carrier 17 of the actuation unit 15 and the adapter body 23. To do so, the first mounting device 62 comprises a connecting part 63 that, as in the exemplary embodiment, is held on the first carrier 17 so as to be separable. A positive-locking and/or a nonpositive-locking connection between the actuation unit 15 and the adapter body 23 can be established by means of the connecting part 63.

In accordance with the example, the connecting part 63 is a hollow-cylindrical part and has an inside diameter that is at least as large as the outside diameter of the first mounting section 26 and, the hollow cylindrical wall 30 of the adapter body 23, respectively. With the connection between the connecting part 63 and the adapter body 23 established, at least one section of the connecting part 63 completely encloses the first mounting section 26 in peripheral direction about the longitudinal axis L of the adapter body 23. In accordance with the example, the connecting part 63 has an annular exterior wall 64 that has an inside thread 65 in at least one axial region. The inside thread 65 can be screwed onto the outside thread 25 on the first mounting section 26 of the adapter body 23. The connection between the inside thread 65 and the outside thread 25 need not be an explosion-proof threaded joint. If the outside thread 25 on the adapter body 23 is used, at the same time, for screwing the adapter body 23 into a thread on the housing opening 24 to establish an explosion-proof threaded joint at that location, it is still necessary that the appropriate tolerances and dimensions be maintained. Considering a modification of the exemplary embodiment, it is also possible to provide a separate outside thread on the adapter body 23, in which case one outside thread is disposed for the explosion-proof threaded connection with the housing 10 and the other outside thread is disposed for the separable connection with the connecting part 63. It is also possible to mount the adapter body in the housing opening 24 in a manner that is different from that of a threaded joint.

On one axial side, the connecting part 63 has an inside ring 66 that has an outside diameter that is smaller than the inside diameter of the exterior wall 64 and is coaxial to the exterior wall 64. As a result of this, an annular gap 67 is formed between the exterior wall 64 and the inside ring 66. The radial width of the annular gap 67 corresponds to at least the radial width of the hollow cylindrical wall 30 of the adapter body 23 adjoining the free end 33 of said wall, i.e., in the exemplary embodiment, along the exterior section 31*b* of the receiving space 31. When the connecting part 63 is screwed onto the hollow cylindrical wall 30, a region of the hollow cylindrical wall 30 adjoining the free end 33 can come into engagement with the annular gap 67.

The inside ring 66 is connected to the exterior wall 64 of the connecting part 63 by means of a cross-piece 68. The cross-piece 68 has the shape of a ring and, in the exemplary embodiment, forms an upper side 69 of the connecting part 63 facing away from the adapter body 23. The cross-piece 68, the inside ring 66 and the axial portion of the exterior wall 64 adjoining the cross-piece 68 are arranged in a U-shape and delimit the annular gap 67.

The inside diameter of the inside ring 66 is selected large enough so that the connecting part 63 with the inside ring 66 can be arranged around the first carrier 17 and around an end section 17*a* of the first carrier 17, respectively. On this end section 17*a* of the first carrier 17, there is an undercut or carrier groove 70. After slipping on the connecting part 63, a holding part 71 can be inserted in this carrier groove 70, preferably at a right angle relative to the axial direction A. In particular FIG. 4 shows this holding part 71. In the exemplary embodiment, said holding part is configured as a holding bracket 72 that has two essentially parallel limbs 73 as in the example, said limbs being connected to each other by an intermediate piece 74. If the holding bracket 72 is inserted into the carrier groove 70, said bracket projects radially—at least in sections—from the carrier groove 70 and forms a contact surface 75 at that point. The contact surface 75 may be oriented so as to be at a right angle or at an oblique angle relative to the axial direction A. Said contact surface is located on the axial side of the holding bracket 72 that faces the connecting part 63. The maximum distance of preferably several regions of the holding part 71 from a longitudinal axis through the end section 17*a* of the first carrier 17, with the holding part inserted in the carrier groove 70, is greater than the inside radius of the inside ring 66. As a result of this, it is ensured that the face 76 of the inside ring 66 can come into contact with the abutment surface 75 of the holding part 71. Consequently, the holding part 71 may also act as a precaution against loss.

The holding part 71 comprises an inside edge deviating from the circular arc profile, by means of which said holding part is arranged in the carrier groove 70. In this manner, the holding part 71 and the holding bracket 72, respectively, cannot be rotated about the axial direction A relative to the end section 17*a* of the first carrier 17.

In modification of the preferred exemplary embodiment, there are other options for implementing the separable connection between the connecting part 63 and the adapter body 23. Instead of a screw connection, the use of bayonet connections, click-on connections or the like is also possible. However, the screw connection has the advantage that the holding force with which the inside ring 66 acts on the contact surface 75 of the holding part 71 when the connecting part 63 is screwed onto the adapter body 23 can be adjusted so as to be variable.

In the exemplary embodiment described here, the holding part 71, together with the first mounting section 26 and the hollow cylindrical wall 30, respectively, forms a rotary position setting means 80 (FIG. 4). In the exemplary embodiment, the rotary position setting means 80 is such that—on the holding part 71—there is a projection 81 extending radially from the exterior surface or the outside edge of the holding part 71. In the exemplary embodiment, the projection 81 extends in axial direction A along the outside edge of the holding part 71. In the embodiment of the holding part 71 in the form of the holding bracket 71 shown here, the projection 81 is located on the intermediate piece 74, for example.

A recess 82 extending from the free end 33 in axial direction A is provided on the inside of the hollow cylindrical wall 30. Preferably, the recess 82 extends up to the stop 32 along the exterior section 31*b* of the receiving space 31. Following the insertion of the holding part 71 in the carrier groove 70, the actuation unit 15 can only be inserted with the holding part 71 in a rotary position about the longitudinal axis L with the end section 17*a* and the holding part 71 in the receiving space 31. In doing so, the projection 81 and the recess 82 preset a clearly defined rotary position. As a result of this, it is ensured that the actuation elements 16 are arranged so as to be in alignment with the adapter plungers 38 in order to ensure the function of the actuation device 11. In one exemplary embodiment that comprises only one adapter plunger 38 coaxially relative to the longitudinal axis L through the adapter body 23, the rotary position setting means 80 can be omitted.

The rotary position setting means 80 can also be implemented by other measures. For example, the outside edge of the holding part 71 may have a form deviating from that of a circle or of an arc of a circle, in which case the interior surface of the hollow cylindrical wall 30 has a contour—at least on the exterior section 31*b*—that is adapted in such a manner that also in this case only a preset rotary position is possible for the insertion of the end section 17*a* with the holding part 71 in the receiving space 31.

By means of a second mounting device 85, it is possible to provide a second connection between the mounting section 27 of the adapter body 23 and the second carrier 19. In the exemplary embodiment shown here, this separable connection can be attained by means of a nonpositive-locking connection and/or a positive-locking connection, in the present case by means of a click-on connection. To do so, the mounting section 27 of the adapter body 23 comprises a catch means 86 that is able to establish a separable catch connection with a counter-catch means 87 on the second carrier 19. The catch means 86 may be several locking catches 88 that can come into contact with corresponding catch surfaces of the counter-catch means 87 in order to form a nonpositive-locking-locking and/or positive connection. The second mounting device 85 ensures the alignment of the at least one adapter plunger relative to the associate switch element 14.

Consequently, a separable connection between the adapter body 23, the first carrier 17 of the actuation unit 15 and the second carrier 19 of the switch unit 19 can be produced by means of the two mounting devices 62, 85. With the connection established, the first carrier 17, the adapter body 23 and the second carrier 19 are immovably connected to each other—with the exception of a technically necessary assembly play—in axial direction A. The actuation face 45 of the at least one actuation element 16 abuts against the first switch face 44 of the associate adapter plunger 38 or this first plunger face 44, at a minimal axial distance. In the same manner, in assembled state, the switch face 57 abuts against the associate second plunger face 56 or is located opposite thereto at a minimal axial distance. Consequently, the adapter plunger 38 can transmit, in axial direction, only the pressure forces from the actuation element 16 to the switch element 14, or vice versa. Due to the loose abutment of the plunger faces 44, 56 against the associate faces 45, 57, a transmission of pulling forces is not possible. Consequently, each of the two plunger faces 44, 56 represents an interface to the actuation element 16, on the one hand, and to the switch element 14, on the other hand. The abutment points or abutment surfaces that came into abutment with the plunger faces 44, 56 on the respectively associate faces 45, 57 are separating locations and, in accordance with the example, separating planes. In the exemplary embodiment described here, neither the actuation element 16 nor the switch element 14 extends through the respective separating plane. Consequently, very simple interfaces are formed between the adapter device 22 and the actuation unit 15, on the one hand, and the adapter device 22 and the switch unit 14, on the other hand.

The assembly of the actuation device 11 is simple and fast. In the exemplary embodiment, the actuation device 11 is assembled as follows:

For example, the first to be installed may be the adapter device 22 with the adapter body 23 in the housing opening 24, for example by screwing the outside thread 25 of the adapter body 23 into the corresponding inside thread of the housing opening 24. In doing so, preferably, the recess 82 is oriented in the desired rotary position about longitudinal axis L of the adapter body 23, at least when the actuation unit 15 comprises a rotary switch or turnkey 18*b*.

Previously or subsequently, the inside ring 66 of the connecting part 63 is slipped over the end section 17*a* and secured against a movement in axial direction A at least toward one side by subsequently inserting the holding bracket 72 in the carrier grove 70.

Subsequently, the actuation unit 15 is connected with the use of the first mounting device 62, and the switch unit 13 is connected with the use of the second mounting device 85, each being separably connected to the adapter body 23. The switch unit 13 is installed only after the adapter body 23 has been mounted in the housing opening 24, whereas the actuation unit 15 can also be mounted before the adapter body 23. The actuation unit 15 is held on the exterior of a housing 10, and the switch unit 13 is held in the interior space 12 of the housing 10.

In the inoperative position, the at least one adapter plunger 38 is pretensioned by the spring 50 toward the associate actuation element 16. If the actuation element 16 is moved in axial direction A against the first end 42 of the adapter plunger 38, the adapter plunger 38 is shifted in the adapter channel 39 corresponding to the movement of the actuation element 16 in axial direction A. In doing so, the adapter plunger 38 also moves the switch element 14 in axial direction A due to the contact of the axial second end 43 with the associate shoulder surface 51. As a result of this, for example, at least one electrical contact associated with the switch element 14 can be switched, i.e., closed or opened.

The invention relates to a actuation device 11 for an explosion-proof housing 10 in compliance with the ignition protection category "pressure-proof encapsulation." The actuation device 11 comprises an actuation unit 15 with a manually actuatable actuation element 16. The actuation element 16 can be moved in an axial direction A. Furthermore, the actuation device 11 comprises a switch unit 14 with at least one switch element 14 for switching at least one associate electrical contact. The actuation unit 15 is located outside the housing 10, whereas the switch unit 13 is located in the interior space 12 of the housing 10. An adapter device 22 mechanically connects the actuation unit 15 and the switch unit 13 and comprises at least one adapter plunger 38 that is supported so as to be movable in axial direction A in order to transmit the movement of the actuation element 16 via the adapter plunger 38 to the at least one switch element 14. The adapter plunger 38 is arranged in an adapter channel 39 so as to be axially shiftable while forming a gap 53 that is resistant to ignition transmission.

LIST OF REFERENCE SIGNS

10 Housing
11 Actuation device
12 Interior space
13 Switch unit
14 Switch element
15 Actuation unit
16 Actuating element
17 First carrier
17*a* End section of the first carrier
18*a* Push-button or push-key
18*b* Rotary switch or turnkey
19 Second carrier
22 Adapter device
23 Adapter body
24 Housing opening
25 Explosion-proof outside thread
26 First mounting section
27 Second mounting section
28 Center section
29 Annular step
30 Hollow cylindrical wall
31 Receiving space
31*a* Interior section
31*b* Exterior section
32 Stop
33 Free end of the hollow cylindrical wall
34 Annular projection
38 Adapter plunger
39 Adapter channel
49 First mouth
41 Second mouth
42 Axial first end
43 Axial second end
44 First plunger face
45 Actuating face
48 Annular groove
49 Locking ring
50 Spring
51 Ring shoulder
52 Axial section
53 Gap resistant to ignition transmission
54 Sealing groove
55 End piece
56 Second plunger face
57 Switch face
58 Seal
62 First mounting device
63 Connecting part
64 Exterior wall of the connecting part
65 Inside thread
66 Inside ring
67 Annular gap
68 crosspiece
69 Upper side of the connecting part
70 Carrier groove
71 Holding part
72 Holding bracket
73 Limb

74 Intermediate piece
75 Contact surface
76 Face of the inside ring
80 Rotary position setting means
81 Projection
82 Recess
85 Second mounting device
86 Catch means
87 Counter-catch means
88 Locking catch
A Axial direction
L Longitudinal axis

The invention claimed is:

1. Actuation device (11) for an explosion-proof housing (10) comprising:

an actuation unit (15) having a first carrier (17);

an actuation element (16) moveable relative to the first carrier (17) in an axial direction (A);

a switch unit (13) having a second carrier (19);

a switch element (14) movable relative to the second carrier (19) in said axial direction (A);

an adapter device (22) having an adapter body (23) extending in the axial direction (A), said adapter body (23) having a first mounting section (26) on one axial end and a second mounting section (27) on the other axial end;

said adapter device (22) having an adapter plunger (38) that is supported so as to be shiftable in an adapter channel (39) extending in the axial direction (A) in the adapter body (23), said adapter plunger (38) and said adapter channel (39) defining therebetween at least one gap (53) resistant to ignition transmission;

said adapter plunger (38) having a first axial end (42) associated with said actuation element (16) and a second axial end (43) associated with said switch element (14) of the switch unit (13); and said first mounting section (26) of said adapter body (23) being separably connected to the first carrier (17) of the actuation unit (15) and the second mounting section (27) if said adapter body (23) being separably connected to the second carrier (19) of the switch unit (13) in such a manner that the two carriers (17, 19) and the adapter body (23) are immovably supported next to each other.

2. The actuation device of claim 1 in which said adapter plunger (38) has on its first axial end (42) a first plunger face (44) that abuts against the actuation element (16) or is located opposite said actuation element (16) a distance apart in axial direction (A).

3. The actuation device of claim 2 in which said adapter plunger (38) has on its second axial end (43) a second plunger face (56) that abuts against said switch element (14) or is located opposite said switch element (14) at a distance apart in axial direction (A).

4. The actuation device of claim 1 in which said adapter device (22) has a first mounting device (62) by means of which the first mounting section (26) of the adapter body (23) is separably connected to the actuation unit (15), and the adapter device (22) has a second mounting device (85) by means of which the second mounting section (27) of the adapter body (23) is separably connected to the switch unit (13).

5. The actuation device in claim 4 in which said first mounting device (62) of said adapter device (22) has a connecting part (63) located on the actuation unit (15), said connecting part (63) being separably connected to the first mounting section (62).

6. The actuation device of claim 5 in which said connecting part (63) is separably connected to the actuation unit (15) by means of a holding part (71).

7. The actuation device of claim 6 in which said holding part (71) engages in a positive-locking manner in a recess (70) on the actuation unit (15) and provides a contact surface (75) for the connecting part (63).

8. The actuation device of claim 6 in which said holding part (71) is in contact with the first mounting section (26) of the adapter body (23) at least at a first location, and said holding part (71) together with the first mounting section (26) of said adapter body (23) form a rotary position setting (80) that establishes the relative rotary position about the axial direction (A) between the actuation unit (15) and the adapter body (23).

9. The actuation device of claim 1 in which the first mounting section (26) of said adapter body (23) is configured as a hollow cylinder.

10. The actuation device of claim 1 in which said adapter body (23) has a center section (28) with a cylindrical exterior contour, and at least one adapter channel (39) extending through said center section.

11. The actuation device of claim 10 in which said center section (28) of said adapter body (23) extends between the first and second mounting sections (26, 27) of said adapter body (23).

12. The actuation device of claim 1 in which the actuation unit (15) and the switch unit (13) are constructed without special ignition protection measures.

13. An explosion proof housing assembly comprising:

a wall formed housing (10) defining an interior space (12);

an actuation device supported by and extending through a wall of said housing;

said actuation device including an actuation unit (15) arranged on an exterior side of said housing wall;

a switch unit (13) arranged in the interior space (12) of the housing (10);

an adapter device (22) extending through said housing wall in an explosion proof manner;

said actuation unit (15) having a first carrier (17);

an actuation element (16) moveable relative to the first carrier (17) in an axial direction (A);

said switch unit (13) having a second carrier (19);

a switch element (14) movable relative to the second carrier (19) in said axial direction (A);

said adapter device (22) having an adapter body (23) extending in the axial direction (A), said adapter body (23) having a first mounting section (26) on one axial end and a second mounting section (27) on the other axial end;

said adapter device (22) having an adapter plunger (38) that is supported so as to be shiftable in an adapter channel (39) extending in the axial direction (A) in the adapter body (23), said adapter plunger (38) and said adapter channel (39) defining therebetween at least one gap (53) resistant to ignition transmission;

said adapter plunger (38) having a first axial end (42) associated with said actuation element (16) and a second axial end (43) associated with said switch element (14) of the switch unit (13); and said first mounting section (26) of said adapter body (23) being separably connected to the first carrier (17) of the actuation unit (15) and the second mounting section (27) if said adapter body (23) being separably connected to the second carrier (19) of the switch unit (13) in such a manner that the two carriers (17, 19) and the adapter body (23) are immovably supported next to each other.

14. The explosion proof housing of claim 13 in which said housing (10) is constructed in compliance with the ignition protection category "pressure-proof encapsulation".

15. The explosion proof housing of claim 13 in which a gap resistant to ignition transmission exists between the adapter body (23) and said housing wall.

16. The explosion proof housing of claim 13 in which said adapter plunger (38) has on its first axial end (42) a first plunger face (44) that abuts against the actuation element (16) or is located opposite said actuation element (16) a distance apart in axial direction (A), and said adapter plunger (38) has on its second axial end (43) a second plunger face (56) that abuts against said switch element (14) or is located opposite said switch element (14) at a distance apart in axial direction (A).

17. The explosion proof housing of claim 13 in which said adapter device (22) has a first mounting device (62) by means of which the first mounting section (26) of the adapter body (23) is separably connected to the actuation unit (15), and the adapter device (22) has a second mounting device (85) by means of which the second mounting section (27) of the adapter body (23) is separably connected to the switch unit (13).

18. The explosion proof housing of claim 13 in which said first mounting device (62) of said adapter device (22) has a connecting part (63) located on the actuation unit (15), said connecting part (63) being separably connected to the first mounting section (62).

19. The explosion proof housing of claim 13 in which the first mounting section (26) of said adapter body (23) is configured as a hollow cylinder.

20. The explosion proof housing of claim 13 in which said adapter body (23) has a center section (28) with a cylindrical exterior contour, and at least one adapter channel (39) extending through said center section, and said center section (28) of said adapter body (23) extends between the first and second mounting sections (26, 27) of said adapter body (23).

* * * * *